(12) United States Patent
Sasaki

(10) Patent No.: US 6,908,312 B2
(45) Date of Patent: Jun. 21, 2005

(54) PRESS-CONTACT TYPE ADAPTER FOR ESTABLISHING CONDUCTION BETWEEN AN ELECTRODE OF AN ELECTRIC PART AND THE ELECTRODE OF AN ELECTRICALLY JOINED MEMBER

(75) Inventor: Yuichiro Sasaki, Matsumoto (JP)

(73) Assignee: Shin-Etsu Polymer Co., Ltd., Tokyo (JP)

( * ) Notice: Subject to any disclaimer, the term of this patent is extended or adjusted under 35 U.S.C. 154(b) by 0 days.

(21) Appl. No.: 10/475,145

(22) PCT Filed: Apr. 25, 2002

(86) PCT No.: PCT/JP02/04111

§ 371 (c)(1),
(2), (4) Date: Oct. 17, 2003

(87) PCT Pub. No.: WO02/091526

PCT Pub. Date: Nov. 14, 2002

(65) Prior Publication Data

US 2004/0166701 A1 Aug. 26, 2004

(30) Foreign Application Priority Data

May 2, 2001 (JP) ........................................ 2001-135438

(51) Int. Cl.$^7$ ........................... H01R 12/00; H05K 1/00
(52) U.S. Cl. ........................................ 439/66; 439/591
(58) Field of Search ........................................ 439/66

(56) References Cited

U.S. PATENT DOCUMENTS

| | | | | |
|---|---|---|---|---|
| 4,029,375 A | * | 6/1977 | Gabrielian | 439/66 |
| 4,707,657 A | * | 11/1987 | Boegh-Petersen | 324/537 |
| 4,961,709 A | * | 10/1990 | Noschese | 439/66 |
| 5,759,047 A | * | 6/1998 | Brodsky et al. | 439/66 |
| 6,338,629 B1 | * | 1/2002 | Fisher et al. | 439/66 |
| 6,341,962 B1 | * | 1/2002 | Sinclair | 439/66 |

FOREIGN PATENT DOCUMENTS

| | | |
|---|---|---|
| JP | 08-306403 A1 | 11/1996 |
| JP | 11-345641 A1 | 12/1999 |
| JP | 2000-67965 A1 | 3/2000 |
| JP | 2000-82522 A1 | 3/2000 |

OTHER PUBLICATIONS

Patent Abstracts of Japan for JP2000–67965 published on Mar. 3, 2000.
Patent Abstracts of Japan for JP2000–82522 published on Mar. 21, 2000.
Patent Abstracts of Japan for JP08–306403 published on Nov. 22, 1996.
Patent Abstracts of Japan for JP11–345641 published on Dec. 14, 1999.

* cited by examiner

Primary Examiner—Hae Moon Hyeon
(74) Attorney, Agent, or Firm—Darby & Darby

(57) ABSTRACT

An adapter includes an insulative base holder 10 interposed between a cellular phone speaker 1 and an electronic circuit board 5, a pair of electrode plates 15 and 15A, arranged left and right, radially outwardly from the approximate center of base holder 10 to the outer peripheral edge of the base holder 10; and first and second coil springs 17 and 18 welded at both ends of each of electrode plates 15 and 15A, and is constructed such that the first coil springs 17 are put in pressing contact with speaker electrodes 4 at the outer peripheral edge on the underside of speaker 1 and the second coil springs 18 are put in pressing contact with approximately concentric board electrodes 6 of electric circuit board 5.

4 Claims, 5 Drawing Sheets

PRESS-CONTACT TYPE ADAPTER FOR ESTABLISHING CONDUCTION BETWEEN AN ELECTRODE OF AN ELECTRIC PART AND THE ELECTRODE OF AN ELECTRICALLY JOINED MEMBER

CROSS-REFERENCE TO RELATED APPLICATIONS

Not Applicable.

STATEMENT REGARDING FEDERALLY SPONSORED RESEARCH OR DEVELOPMENT

Not Applicable.

INCORPORATION-BY-REFERENCE OF MATERIAL SUBMITTED ON A COMPACT DISC

Not Applicable.

BACKGROUND OF THE INVENTION

1. Technical Field

The present invention relates to a press-contact type adapter for establishing conductive connection of an electrode of an acoustic output part etc. of a compact communication tool such as a cellular phone, PDA etc., with an electrode of a circuit board etc.

2. Background Art

A cellular phone incorporates various parts such as a microphone etc. A speaker 1 is one example of these. As shown in FIGS. 25 and 26, speaker 1 is given in a button-shaped form or the like, having a pair of speaker electrodes 4 on the flat undersurface along the outer peripheral edge. Each speaker electrode 4 should be electrically connected to a board electrode 6 on an electronic circuit board 5.

It should be mentioned that there are not a few cases where substrate electrodes 6 on electronic circuit board 5 are formed substantially concentrically in order to eliminate directivity and improve assembly performance (see FIG. 27). In this case, speaker 1 as is cannot be connected to board electrodes 6 of electronic circuit board 5. To deal with this, in a conventional configuration, lead wire for pitch conversion, is used to establish connection of speaker electrodes 4 of speaker 4 with board electrodes 6 of electronic circuit board 5.

The speaker 1 of the conventional cellular phone is connected to board electrodes 6 of electronic circuit board 5 in the above mentioned manner. Since use of lead wire entails use of soldering, it is impossible to achieve smooth, simplified and quick connecting work, and also the result lacks reliability and certainty.

The present invention has been devised in view of the above, it is therefore an object of the present invention to provide a press-contact type adapter which permits smooth, simplified and quick connecting work for establishing conduction of the electrodes at the outer peripheral edge of an electric part with the electrodes of an electrically joined member and which can improve conduction reliability.

BRIEF SUMMARY OF THE INVENTION

The present invention has been devised in order to achieve the above object and the gist of the invention is as follows.

First, the first aspect of the present invention resides in a press-contact type adapter for establishing conduction between an electrode at the outer peripheral part of an electric part and an electrode of an electrically joined member, comprising:

an insulative base holder interposed between the electric part and the electrically joined member; and first and second spring contacts disposed in the base holder and in conductive connection with each other, characterized in that the first spring contact is put in contact with the electrode of the electric part and the second spring contact is put in contact with the electrode of the electrically joined member.

Next, the second aspect of the present invention resides in the press-contact type adapter defined in the above first aspect, further comprising: an electrode plate attached from the outer peripheral part of the base holder to the approximate center, wherein a first coil spring in contact with the electrode of the electric part is provided on the obverse side at almost one end of the electrode plate while a second coil spring in contact with the electrode of the electrically joined member is provided on the underside side at almost the other end of the electrode plate.

Further, the third aspect of the present invention resides in the press-contact type adapter defined in the above first aspect, further comprising: an electrode plate attached from the outer peripheral of the base holder to the approximate center, wherein a first spring contact in contact with the electrode of the electric part is provided on the obverse side at almost one end of the electrode plate while a second spring contact in contact with the electrode of the electrically joined member is provided on the underside side at almost the other end of the electrode plate, and at least one of these first and second spring contacts is formed of a leaf spring.

Here, examples of the electric part in the present invention at least include electro-acoustic parts, specifically, various types of speakers, microphones such as condenser microphones, receivers and the like. Examples of the electrically joined member at least include electronic circuit boards, printed boards, flexible circuit boards. The insulative base holder may be formed in a circular, rectangular, square or polygonal shape, depending on the shapes of the electric part and electrically joined member. The first and second spring contacts may conduct indirectly by way of an electrode plate or may directly conduct as long as they are connected to each other (so as to allow electric current to flow). As the first and second spring contacts, leaf springs, coil springs and the like may be used as appropriate. The coil spring may be formed with a diameter wholly identical or may be formed with partly varying diameters.

According to the present invention, when an electric part is electrically connected to an electrically joined member, the electric part and the press-contact type adapter are laid over so that the first spring contacts located at the outer part of the base holder are put into conductive contact with the outer peripheral part of the electric part and the press-contact type adapter is laid over the electrically joined member while the second spring contacts located on the inner side of the base holder are put into conductive contact with the electrodes of the electrically joined member, whereby the displaced first and second spring contacts and the conductive portions therebetween create a conductive path, so that the electric part can be electrically connected to the electrically joined member. In this way, since there is no need to use lead wires etc., for connection, it is possible to omit soldering work.

BRIEF DESCRIPTION OF THE SEVERAL VIEWS OF THE DRAWINGS(S)

DETAILED DESCRIPTION OF THE INVENTION

Figure 1:
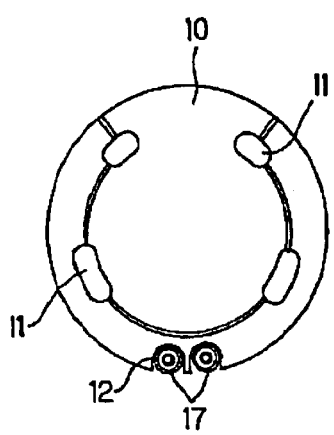
FIG. 1 is an obverse view showing an embodiment of a press-contact type adapter according to the present invention.
Figure 2:
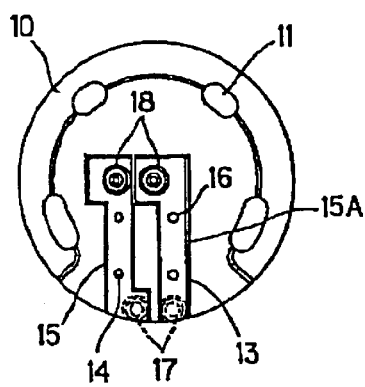
FIG. 2 is a reverse view showing an embodiment of a press-contact type adapter according to the present invention.
Figure 3:
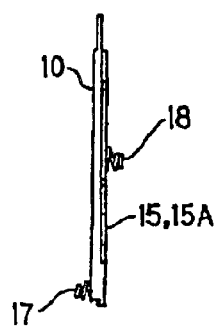
FIG. 3 is a side view showing an embodiment of a press-contact type adapter according to the present invention.
Figure 4:
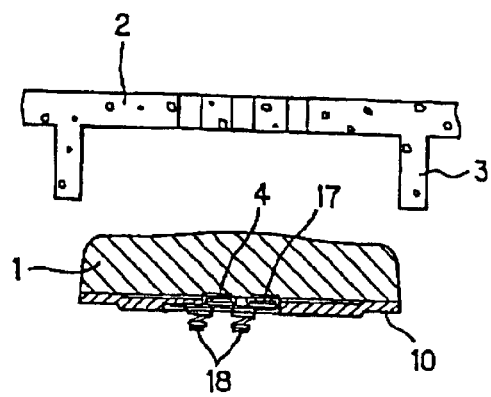
FIG. 4 is an illustrative view of an embodiment of a press-contact type adapter of the present invention, showing a state where a press-contact type adapter is laid over and pressed into contact with a speaker and the speaker is about to be fitted to a positioning rib of a housing.
Figure 5:
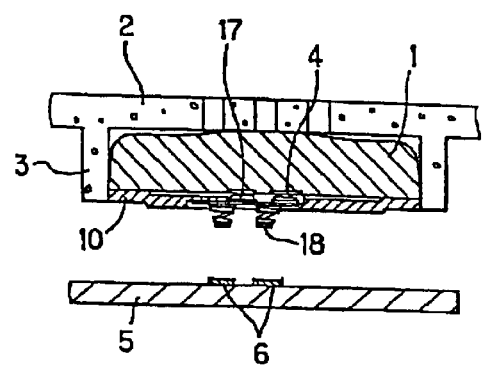
FIG. 5 is an illustrative view showing a state where an electronic circuit board is laid from below over the press-contact type adapter of FIG. 4.
Figure 6:
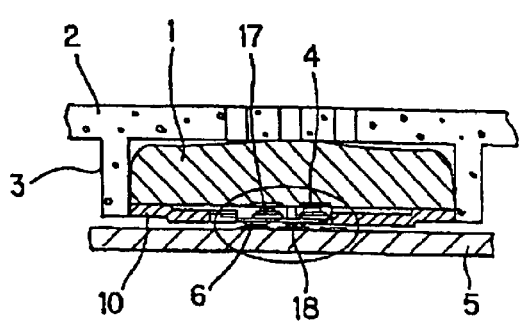
FIG. 6 is an illustrative view showing a state where a speaker with an embodiment of a press-contact type adapter according to the present invention is electrically connected to an electronic circuit board.
Figure 7:
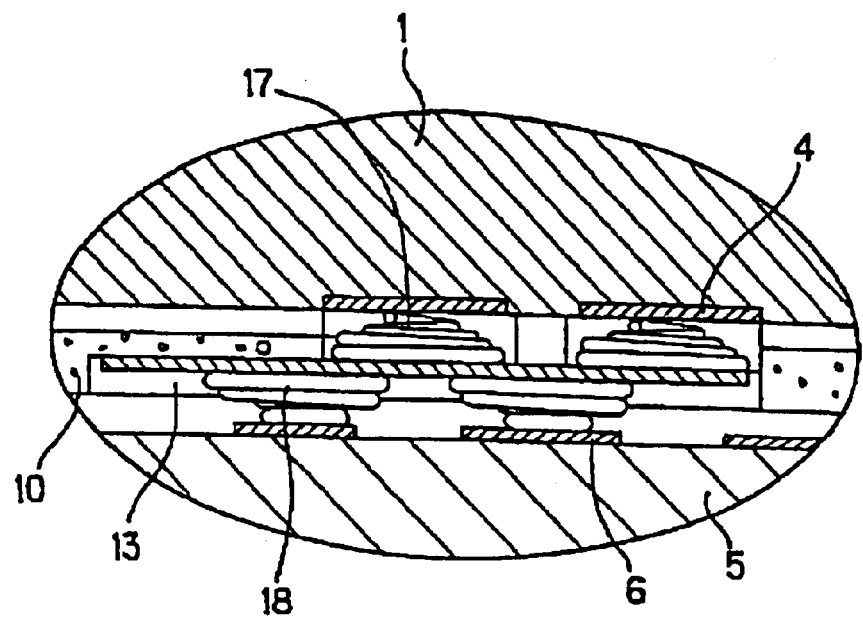
FIG. 7 is an enlarged sectional view showing the part enclosed by the oval in FIG. 6.

Now, the preferred embodiment of the present invention will be described with reference to the drawings. A press-contact type adapter in the embodiment includes: as shown in FIGS. 1 through 13, an insulative base holder 10 sandwiched between a miniature speaker 1 as an electric part of a cellular phone and an electronic circuit board 5 as an electrically joined member; a pair of electrode plates 15 and 15A, arranged left and right, radially outwardly from the approximate center to the outer peripheral edge of the base holder 10; and first and second coil springs 17 and 18 welded on each of electrode plates 15 and 15A and is constructed such that the first coil springs 17 are put in elastic contact with speaker electrodes 4 of speaker 1 and the second coil springs 18 are put in elastic contact with board electrodes 6 of electric circuit board 5 so as to convert the pitch.

As shown in FIGS. 4 to 7, speaker 1 is made of a solid piece having a roughly projected section or formed in a button shape, for example, and is fitted within, for example, a cylindrical speaker fixing rib 3 of a housing 2 for the cellular phone. A pair of speaker electrodes 4 are disposed at the outer peripheral edge on the flat underside of this speaker 1. These speaker electrodes 4 should be electrically connected to board electrodes 6 on electronic circuit board 5. Electronic circuit board 5, as shown in FIGS. 4 to 7, is a printed circuit board or the like, for example, and the board electrodes 6 are arranged approximately concentrically (in other words 'doughnut shaped') in order to eliminate directivity and improve assembly performance.

Figure 8:
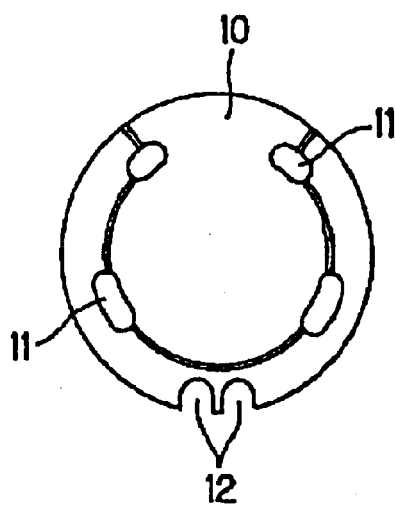
FIG. 8 is an obverse view showing a base holder in an embodiment of a press-contact type adapter according to the present invention.
Figure 9:
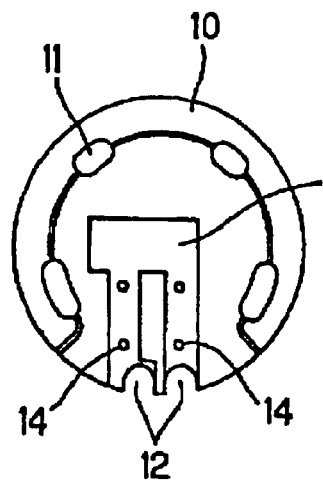
FIG. 9 is a reverse view showing a base holder in an embodiment of a press-contact type adapter according to the present invention.

Base holder 10 has a thin disk form (of 0.7 mm, for example) as shown in FIGS. 8 and 9, made of a resin such as LCP (liquid crystal polymer) which is excellent in strength etc., or other kinds of engineering plastics, so as to be laid on the undersurface of speaker 1. This base holder 10 has a number of passage holes 11 for sound exchange, arranged annularly and a pair of cutouts 12 of a semi-oval shape formed side by side at the outer periphery so as to expose first coil springs 17 to the front side. A positioning setter 13 for the electrode plates 15 and 15A pair is partially formed on the underside of base holder 10, from the approximate center of base holder 10 toward the paired cutouts 12 and thereabout. A number of positioning pins 14 are formed upright at predetermined intervals on this positioning setter 13.

Figure 10:
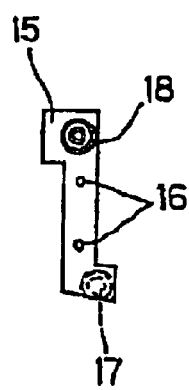
FIG. 10 is an illustrative view showing an electrode plate in an embodiment of a press-contact type adapter according to the present invention.
Figure 11:
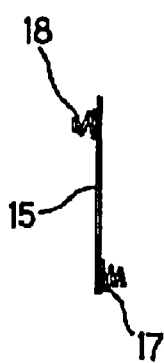
FIG. 11 is a side view of FIG. 10.
Figure 14:
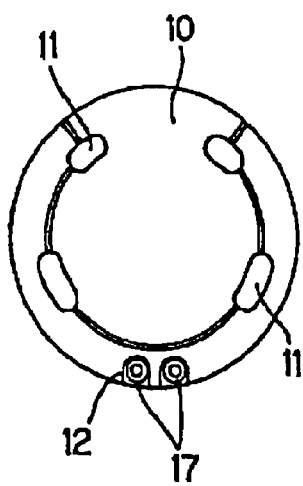
FIG. 14 is an obverse view showing the second embodiment of a press-contact type adapter according to the present invention.
Figure 15:
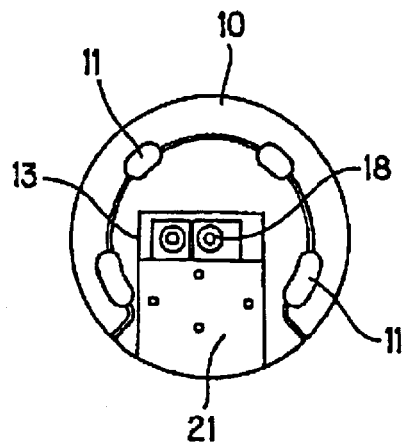
FIG. 15 is a reverse view showing the second embodiment of a press-contact type adapter according to the present invention.
Figure 18:
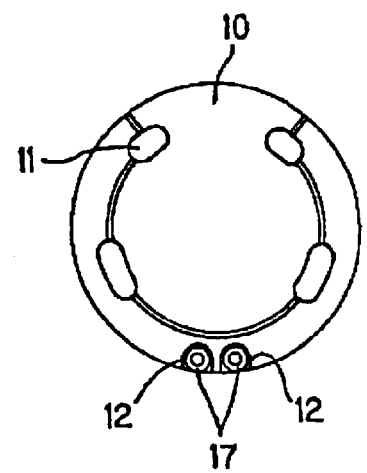
FIG. 18 is an obverse view showing the third embodiment of a press-contact type adapter according to the present invention.
Figure 16:
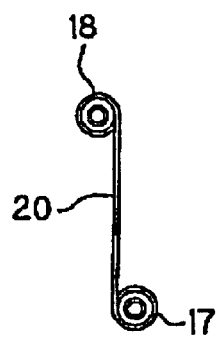
FIG. 16 is an obverse view showing first and second coil springs in the second embodiment of a press-contact type adapter according to the present invention.
Figure 19:
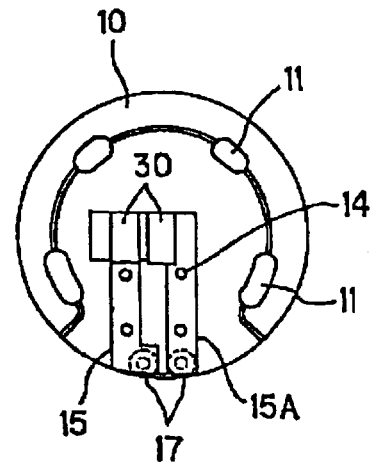
FIG. 19 is a reverse view showing the third embodiment of a press-contact type adapter according to the present invention.
Figure 17:
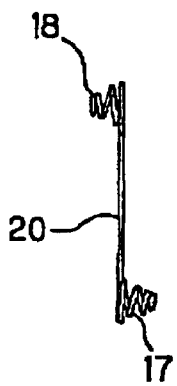
FIG. 17 is a side view of FIG. 16.
Figure 20:
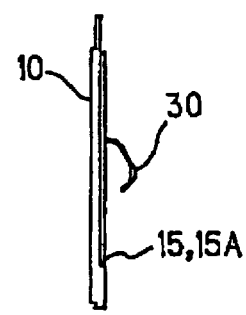
FIG. 20 is a side view showing the third embodiment of a press-contact type adapter according to the present invention.
Figure 21:
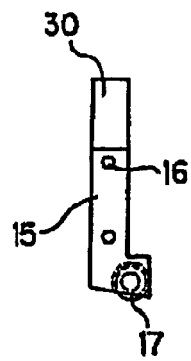
FIG. 21 is an obverse view showing an electrode plate with a coil spring and a leaf spring in the third embodiment of a press-contact type adapter according to the present invention.
Figure 24:
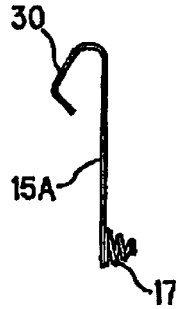
FIG. 24 is a side view of FIG. 23.
Figure 25:
FIG. 25 is a side view of a speaker.
Figure 22:
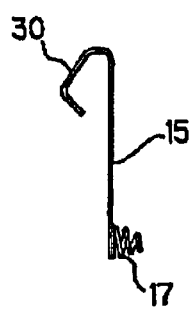
FIG. 22 is a side view of FIG. 21.
Figure 26:
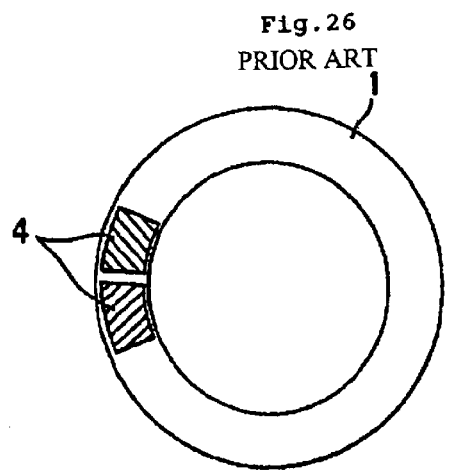
FIG. 26 is a bottom view of FIG. 25.
Figure 23:
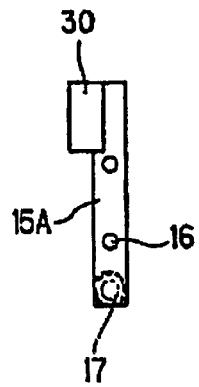
FIG. 23 is an obverse view showing another electrode plate with a coil spring and a leaf spring in the third embodiment of a press-contact type adapter according to the present invention.
Figure 27:
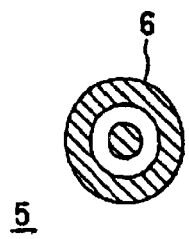
FIG. 27 is a plan view showing board electrodes of an electronic circuit board.

As shown in FIGS. 10 and 11, electrode plate 15 is formed of an approximate Z-shaped thin plate (of 0.1 mm, for example) made of phosphor bronze with its surface treated with gold plating or the like, and is fitted to positioning setter 13 of base holder 10, extending from the approximate center of base holder 10 to cutout 12. This elongated conductive electrode plate 15 has a plurality of positioning holes 16 formed at predetermined intervals, each positioning hole 16 fitted onto positioning pin 14 of base holder 10, then each positioning pin 14 is melted and caulked.

Welded and supported by solder etc. on the surface of electrode plate 15 at almost one end is conductive first coil spring 17 which will be located at the approximate outer peripheral edge of base holder 10. On the underside of electrode plate 15 at almost the other end, conductive second coil spring 18 located at the approximate center of base holder 10 is welded and supported by solder etc. These first and second coil springs 17 and 18 are formed of SUS 304 etc., with its surface treated with gold plating etc., so as to form a conically or frustoconically wound shape with its diameter gradually varied (e.g., diameter: 0.12 to 0.14 mm, height: 1.1 to 1.2 mm), so that upper, reduced diametric coils can fit within, i.e., put into the lower, greater diametric coils when being compressed.

Figure 12:
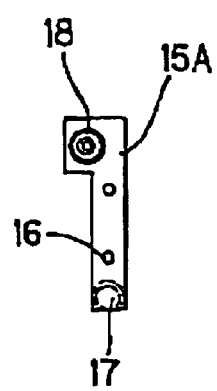
FIG. 12 is an illustrative view showing another electrode plate in an embodiment of a press-contact type adapter according to the present invention.
Figure 13:
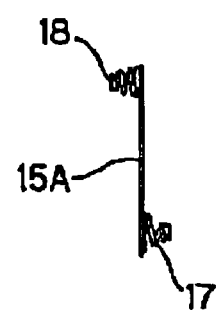
FIG. 13 is a side view of FIG. 12.

Electrode plate 15A, as shown in FIGS. 12 and 13, is formed of an approximate L-shaped thin plate (of 0.1 mm, for example) made of phosphor bronze with its surface treated with gold plating or the like, and is fitted to positioning setter 13 of base holder 10, extending from the approximate center of base holder 10 to cutout 12. This elongated conductive electrode plate 15A has a plurality of positioning holes 16 formed at predetermined intervals, each positioning hole 16 fitted onto positioning pin 14 of base holder 10, then each positioning pin 14 is melted and caulked.

Further, conductive first coil spring 17 which will be located at the approximate outer peripheral edge of base holder 10 is welded and supported by solder etc. on the obverse side at almost one end of electrode plate 15A. On the underside of electrode plate 15A at almost the other end, conductive second coil spring 18 located at the approximate center of base holder 10 is welded and supported by solder etc. These first and second coil springs 17 and 18 are formed in the same manner as above, so the description is omitted.

In the above configuration, when speaker 1 is electrically connected to electronic circuit board 5, first the press-contact type adapter of the present embodiment is laid over the underside of speaker 1 so that first coil springs 17 are pressed against speaker electrodes 4, establishing conduction therebetween. Then speaker 1 is fixed into speaker fixing rib 3 of housing 2 without need to take the fixing position of speaker 1 into consideration (see FIG. 4). In this way the speaker 1 has been fitted to speaker fixing rib 3, then electronic circuit board 5 is pressed and laminated over the press-contact type adapter (see FIG. 5) so that board electrodes 6 of electronic circuit board 5 are pressed against the second coil springs 18, establishing conduction therebetween. Thereby, electrode plates 15 and 15A, flexed first and second coil springs 17 and 18 create a conduction path, whereby it is possible to electrically connect the speaker 1 to electronic circuit board 5 by converting the pitch (see FIGS. 6 and 7).

In accordance with the above configuration, since first and second coil springs 17 and 18 which are in conductive contact with each other are positioned on the inner and outer sides of base holder 10, it is possible to connect a speaker 1 having speaker electrodes 4 at the outer peripheral edge on its underside to roughly concentric board electrodes 6, in a positive and beneficial manner. Further, since no lead wire is used at all as used for conventional connection, unstable and troublesome soldering work can be definitely omitted. Accordingly, it is possible to achieve smooth, simplified and quick connecting work, and still markedly improve the reliability and certainty of the electric conduction.

Further, since not only the base holder 10 is given in a very thin form, but first and second coil springs 17 and 18 are constructed so that their upper portion is compressed and retracted into the lower portion when they are put into conductive connection, it is possible to markedly reduce the height required for packaging assembly (for example, the height can be reduced as low as 1 mm) and reserve a required space of movement. Moreover, since no directivity exists with respect to housing 2 upon assembly, the assembly can be remarkably simplified, thus making a greater contribution toward reducing the manufacturing cost as well as shortening the assembly time.

Next, FIGS. 14 to 17 show the second embodiment of the present invention, wherein a long linear conductive length of wire 20 is shaped so that both ends are coiled forming first and second coil springs 17 and 18 connected to each other and the first and second coil springs 17 and 18 of this one-piece structure are assembled into positioning setter 13 of base holder 10 and covered by an electrode fixing cover 21. The other parts are the same as the above embodiment, so the description is omitted.

Also in this embodiment, the same operation and effect as above can be expected and it is apparent that a further structural simplification can be achieved.

Next, FIGS. 18 to 24 show the third embodiment of the present invention, wherein almost the other ends of electrode plates 15 and 15A are bent so as to form simple leaf springs 30 in place of the second coil springs 18, whereby the pitch is converted by placing buckled leaf springs 30 into press-contact with board electrodes 6 of electronic circuit board 5 to establish conduction. The other parts are the same as the above embodiment, so the description is omitted.

Also in this embodiment, the same operation and effect as above can be expected. Further, this configuration is markedly effective when the second coil spring 18 cannot be used. It is also possible to reduce the number of parts and simplify the configuration by omitting separate second coil springs 18.

Though plural passage holes 11 are set out in base holder 10, the number and shape of the plural passage holes 11 can be increased or decreased as appropriate. Instead of providing a pair of cutouts 12 side by side to expose first coil springs 17 to the front side, at the outer peripheral edge of base holder 10, a pair of exposure holes for exposing first coil springs 17 to the front side may be formed side by side near the outer peripheral portion of base holder 10. Though, in the above embodiment, electrode plates 15 and 15A are surface treated with gold plating, the invention should not be limited thereto. For example, these plates may be surface treated with tin plating or the like.

Though first and second coil springs 17 and 18 are welded to electrode plates 15 and 15A with solder or the like, the present invention should not be limited thereto. For example, first and second coil springs 17 and 18 may be provided for electrode plates 15 and 15A by supersonic welding, laser welding or the like. Moreover, a substantial part of one end of electrode plates 15 and 15A may be buckled forming first coil springs 17 so as to convert the pitch by pressing the buckled leaf springs into conductive contact with speaker electrodes 4. Still more, both the ends of electrode plates 15 and 15A may be bent forming leaf springs substitutable for the first and second coil springs 17 and 18, so that these buckled leaf springs will be put in pressing contact with speaker electrodes 4 and board electrodes 6.

INDUSTRIAL APPLICABILITY

As has been described heretofore, the present invention is effective in achieving smooth, simplified and fast connecting work for connecting the electrodes at the outer peripheral portion of an electric part with the electrodes of an electrically joined member. Further, since the connection needs no soldering, it is possible to improve electric conduction reliability between electrodes.

What is claimed is:

1. A press-contact type adapter for establishing conduction between an electrode at the outer peripheral part of an electric part and an electrode of an electrically joined member, comprising:

an insulative base holder interposed between the electric part and the electrically joined member; and first and second spring contacts disposed in the base holder and in conductive connection with each other, characterized in that the first spring contact is put in contact with the electrode of the electric part and the second spring contact is put in contact with the electrode of the electrically joined member; and an electrode plate attached from the outer peripheral part of a base holder cutout, exposing the first spring contact, to the approximate center, wherein the first spring contact in contact with the electrode of the electric part is provided on the obverse side at almost one end of the electrode plate while the second spring contact in contact with the electrode of the electrically joined member is provided on the underside at almost the other end of the electrode plate.

2. The press-contact type adapter according to claim 1, further comprising: an electrode plate attached from the outer peripheral part of the base holder cutout, exposing the first spring contact, to the approximate center, wherein the first spring contact in contact with the electrode of the electric part is provided on the obverse side at almost one end of the electrode plate while the second spring contact in contact with the electrode of the electrically joined member is provided on the underside at almost the other end of the electrode plate, and at least one of these first and second spring contacts is formed of a leaf spring.

3. The press-contact type adapter according to claim 1, wherein the spring contact is a coil spring.

4. The press-contact type adapter according to claim 3, wherein the coil spring is shaped so that the coil diameter gradually becomes smaller towards its distal end in a conical or frustoconical shape so that the upper reduced diametric coils can fit within the greater diametric coils when compressed.

* * * * *